United States Patent [19]

Kasahara et al.

[11] Patent Number: 4,910,571
[45] Date of Patent: Mar. 20, 1990

[54] OPTICAL SEMICONDUCTOR DEVICE

[75] Inventors: Kenichi Kasahara; Yoshiharu Tashiro, both of Tokyo, Japan

[73] Assignee: NEC Corporation, Tokyo, Japan

[21] Appl. No.: 184,565

[22] Filed: Apr. 21, 1988

[30] Foreign Application Priority Data

Apr. 21, 1987 [JP] Japan ................................. 62-99402
Apr. 21, 1987 [JP] Japan ................................. 62-99403
Dec. 25, 1987 [JP] Japan ................................. 62-331734

[51] Int. Cl.$^4$ ..................... H01L 29/205; H01L 31/06
[52] U.S. Cl. ......................................... 357/30; 357/16; 357/17; 357/19; 372/8; 372/50; 350/355; 330/4.3
[58] Field of Search ....................... 357/16, 17, 19, 30; 372/8, 50; 332/7.51; 350/355

[56] References Cited

U.S. PATENT DOCUMENTS

| | | | |
|---|---|---|---|
| 4,152,713 | 5/1979 | Copeland, III et al. | 357/19 |
| 4,468,772 | 8/1984 | Oudar | 372/50 |
| 4,547,956 | 10/1985 | Brouadma et al. | 372/50 |
| 4,675,518 | 6/1987 | Oimura et al. | 372/50 |
| 4,806,997 | 2/1989 | Simmons et al. | 357/16 |

FOREIGN PATENT DOCUMENTS

| | | | |
|---|---|---|---|
| 55-86174 | 6/1980 | Japan | 357/19 |
| 55-98880 | 7/1980 | Japan | 357/19 |
| 57-166081 | 10/1982 | Japan | 357/19 |
| 58-48481 | 3/1983 | Japan | 357/19 |

OTHER PUBLICATIONS

Sze, *Physics of Semiconductor Devices*, J. Wiley & Sons, N.Y., 1969, p. 724.
G. W. Taylor et al, "A new double heterostructure ... epitaxy", J. Appl. Phys., 59(2), Jan. 15, 1986, pp. 596–600.

Primary Examiner—Andrew J. James
Assistant Examiner—Jerome Jackson, Jr.
Attorney, Agent, or Firm—Sughrue, Mion, Zinn, Macpeak & Seas

[57] ABSTRACT

An optical semiconductor device comprises cathode and anode regions, and a gate region having a forbidden band gap narrower than those of the cathode and anode regions. The gate region is sandwiched by the cathode and anode regions. The optical semiconductor device further comprises a plurality of windows for receiving and radiating lights so that the alignment of light axes can be easily performed for a plurality of input and output lights.

3 Claims, 6 Drawing Sheets

OPTICAL SEMICONDUCTOR DEVICE

FIELD OF THE INVENTION

The invention relates to an optical semiconductor device, and more particularly to an optical semiconductor device which is applied to an optical switch, an optical memory, an optical amplifier, an optical wavelength conversion means and so on.

BACKGROUND OF THE INVENTION

Attention has been drawn to a p-n-p-n- junction device which is applied to the following optical switch, an optical amplifier, an optical memory, an optical wavelength conversion means, etc. in the field of optical computing, an optical interconnection, an optic-electric integrated circuit, etc. One such p-n-p-n junction devices has been described on pages 596 to 600 of "J. Appl. Phys. 59(2), 15 Jan. 1986" as entitled "A new double heterostructure optoelectronic switching device using molecular beam epitaxy" by G. W. Taylor et. al. The p-n-p-n junction device comprises a buffer layer of n-GaAs having an impurity density of $5 \times 10^{17}$ cm$^{-3}$ and a thickness of 0.5 μm, a cathode layer of n-Al$_{0.4}$Ga$_{0.6}$As having an impurity density of $5 \times 10^{17}$ cm$^{-3}$ and a thickness of 1 μm, a p-gate layer of p-GaAs having an impurity density of $1 \times 10^{19}$ cm$^{-3}$ and a thickness of 50 Å, an n-gate layer of n-GaAs having an impurity density of $1 \times 10^{17}$ cm$^{-3}$ and a thickness of 1 μm, an anode layer of p-Al$_{0.4}$Ga$_{0.6}$As having an impurity density of $5 \times 10^{18}$ cm$^{-3}$ and a thickness of 1 μm, and a cap layer of p-GaAs having an impurity density of $1 \times 10^{19}$ cm$^{-3}$ and a thickness of 0.1 μm which are grown sequentially on a substrate of n-GaAs by using molecular beam epitaxy. The p-n-p-n junction device further comprises a ring shaped p-electrode of AuZn alloy and an n-electrode of AuGeNi alloy which are provided on the top surface of the cap layer and the back surface of the substrate respectively.

The device is considered to be a thyristor having a p-n-p-n junction so that a switching operation can be performed therein. In operation, a switching voltage under which the device is turned on is shifted in the direction of a lower voltage in a case where an input light is supplied thereto. Although substantially no electric current is passed through the device in the OFF state, electric current is passed therethrough in the ON state. The electric current which is passed in the ON state is varied dependent on a biased value determined by a load resistance which is connected in series to a power source. On this occasion, light emission is induced in the presence of a light emitting layer of the device. For the reason described above, the ON state is obtained in the device in accordance with the switching-on thereof, when light is supplied thereto in a case where a voltage slightly lower than a switching voltage is applied to the device. Therefore, the device can be used for an optical switch, an optical logic device, etc. because light emission is obtained therein under the ON state.

According to the conventional p-n-p-n junction device, however, there is a disadvantage that in an optical part like an optical isolator, a beam splitter, etc. must be provided in an optical system thereby making the cost of the optical system higher. This is true because the input and output lights are transmitted on a common light path since the input light is supplied to a light input/output window, and the output light is radiated from the light input/output window or from a light output window which is provided on an opposite surface of the device. For the same reason, the alignment of light axes is difficult to performed with input and output lights, especially in the case where a plurality of input or output lights are utilized in the device.

Further, there is another disadvantage in that wavelengths are deviated between the input and output lights such that application of the device is difficult, especially, to an optical amplifier. This is one reason why the receiving and emitting of the lights are performed in the n-gate layer thereof whereby light is received in a wavelength shorter than a forbidden band wavelength of the n-gate layer, while light is emitted in a wavelength approximately equal to the forbidden band wavelength. Thus a wavelength is shifted in the direction of a longer wavelength in the case where the device is used for an optical amplifier or an optical wavelength conversion means.

SUMMARY OF THE INVENTION

Accordingly, it is an object of the invention to provide an optical semiconductor device in which the alignment of light axes can be easily obtained among a plurality of input or output lights.

It is a further object of the invention to provide an optical semiconductor device in which the receiving and emitting of lights are performed in separated regions.

It is a still further object of the invention to provide an optical semiconductor device in which a predetermined wavelength of light can be selected for the input or output light so that the construction of an optical system is optimized in a specified use.

According to the invention, an optical semiconductor device comprises, a cathode region formed by a n-semiconductor layer, an anode region formed by a p-semiconductor layer, a gate region including a plurality of semiconductor layers which are sandwiched by said cathode and anode regions, an n-electrode provided on the side of said cathode region, and a p-electrode provided on the side of said anode region, wherein a forbidden band gap of said gate region is narrower than those of said cathode and anode regions, and a plurality of windows are provided for receiving and radiating lights.

BRIEF DESCRIPTION OF THE DRAWINGS

The invention will be explained in more detail in conjunction with following drawings wherein.

DESCRIPTION OF THE PREFERRED EMBODIMENTS

Before explaining an optical semiconductor device in a first embodiment according to the invention, the aforementioned conventional p-n-p-n junction device will be explained in FIGS. 1A and 1B. The p-n-p-n junction device comprises a buffer layer 12 of n-GaAs having an impurity density of $5 \times 10^{17}$ cm$^{-3}$ and a thickness of 0.5 μm, a cathode layer 13 of n-Al$_{0.4}$Ga$_{0.6}$As having an impurity density of $5 \times 10^{17}$ cm$^{-3}$ and a thickness of 1 μm, a p-gate layer 14 of p-GaAs having an impurity density of $1 \times 10^{19}$ cm$^{-3}$ and a thickness of 50 Å, an n-gate layer 15 of n-GaAs having an impurity density of $1 \times 10^{17}$ cm$^{-3}$ and a thickness of 1 μm, an anode layer 16 of p-Al$_{0.4}$Ga$_{0.6}$As having an impurity density of $5 \times 10^{18}$ cm$^{-3}$ and a thickness of 1 μm, and a cap layer 17 of p-GaAs having an impurity density of $1 \times 10^{19}$ cm$^{-3}$ and a thickness of 0.1 μm which are grown sequentially on a substrate 11 of n-GaAs by using molecular beam epitaxy. The p-n-p-n junction device further comprises a ring shaped p-electrode 18 of AuZn alloy and an n-electrode 19 of AuGeNi alloy which are provided on the top surface of the cap layer 17 and the back surface of the substrate 11, respectively.

Operation and disadvantages of the conventional p-n-p-n junction device were described before so that repeated explanations are omitted here.

Next, an optical semiconductor device in a first embodiment according to the invention will be described in FIGS. 2A and 2B. The optical semiconductor device is of the same materials and compositions as those of the conventional device as described in FIGS. 1A and 1B, and comprises a buffer layer 22 of n-GaAs having an impurity density of $5 \times 10^{17}$ cm$^{-3}$ and a thickness of 0.5 μm, a cathode layer 23 of n-Al$_{0.4}$Ga$_{0.6}$As having an impurity density of $5 \times 10^{17}$ cm$^{-3}$ and a thickness of 1 μm, a p-gate layer 24 of p-GaAs having an impurity density of $1 \times 10^{19}$ cm$^{-3}$ and a thickness of 50 Å, an n-gate layer 25 of n-GaAs having an impurity density of $1 \times 10^{17}$ cm$^{-3}$ and a thickness of 1 μm, an anode layer 26 of p-Al$_{0.4}$Ga$_{0.6}$As having an impurity density of $5 \times 10^{18}$ cm$^{-3}$ and a thickness of 1 μm, and a cap layer 27 of p-GaAs having an impurity density of $1 \times 10^{19}$ cm$^{-3}$ and a thickness of 0.1 μm which are grown sequentially on a substrate 21 of n-GaAs by using molecular beam epitaxy. Reference numeral 28 indicates a p-electrode of AuZn alloy provided on the top surface of the cap layer 27 in which two circular light input windows 20A and a circular light output window 20B are provided, and reference numeral 29 indicates an n-electrode of AuGeNi alloy provided on the back surface of the substrate 21.

Figure 3:
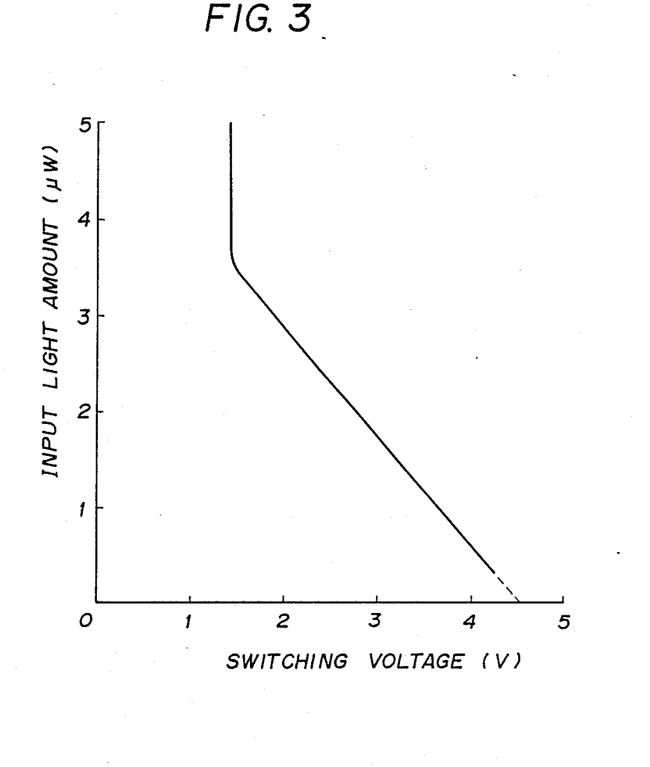
FIG. 3 is an explanatory chart showing a relation between a switching voltage and an input light amount in the optical semiconductor device in the first embodiment according to the invention.

A relation between a switching voltage under which the optical semiconductor device is turned on and an input light amount supplied thereto is shown in FIG. 3. As clearly understood therefrom, a switching voltage of the device is approximately 4.5 V in a case where no input light is supplied through the light input windows 20A thereto. The device is turned on to radiate output light 1B from the light output window 20B when one or both of the input lights 1A each having an input light amount of 1 μW are supplied through one or both of the light input windows 20A thereto in a case where a voltage of more than 3.7 V is applied thereto. Otherwise, the device is turned on when both input lights 1A are supplied thereto in a case where a voltage of 2.8 to 3.6 V is applied thereto. Therefore, the device can be used for an optical logic device in accordance with the operation described above.

The optical semiconductor device in the first embodiment according to the invention is different from the aforementioned conventional device only in that the two light input windows 20A and the light output window 20B are provided in the p-electrode 28 in the invention, while only one light input/output window 10 is provided in the p-electrode 18 in the conventional device. In the invention, however, the single p and n-electrodes 28 and 29 are common to the whole device. For this reason, it is evident that the whole device is turned on by either of the input lights 20A. In the first embodiment, further, the construction of the light input windows 20A is the same as that of the light output window 20B so that output light is radiated even from the light input windows 20A. On the other hand, input light may be supplied through the light output window 20B thereto so that the turning-on of the device can be obtained. As understood from the explanations in the first embodiment, a plurality of light output windows may be provided so that a plurality of output lights are radiated therefrom. In conclusion, the number of light input and output windows is not limited to a specified number.

In an optical semiconductor device in the first embodiment according to the invention, a function of optical logic operation, calculation, etc. is easily performed with regard to a plurality of input lights, while such a function is impossible in the conventional device due to the difficulties in the alignment of the light axes.

Figure 4:
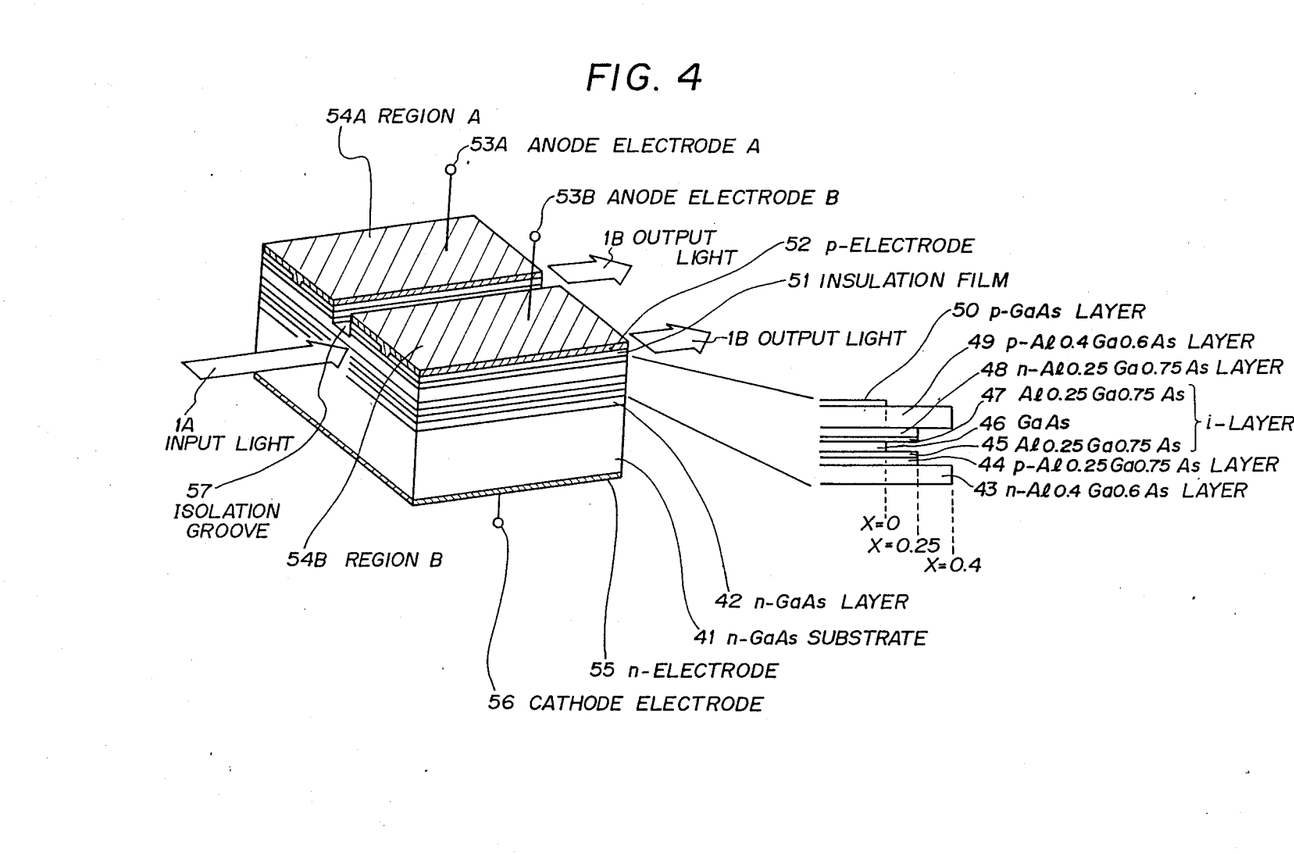
FIG. 4 is a perspective view showing an optical semiconductor device in a second embodiment according to the invention.

In FIG. 4, there is shown an optical semiconductor device in a second embodiment according to the invention. The optical semiconductor device is also based on a p-n-p-n structure, and comprises an intrinsic layer which includes an active layer 46 of undoped GaAs having a thickness of 0.1 μm for inducing laser oscillation in the ON state, and layers 45 and 47 of undoped Al$_{0.5}$Ga$_{0.75}$As between which the active layer 46 is sandwiched. The layers 45, 46 and 47 have p-impurity densities of $1 \times 10^{15}$ cm$^{-3}$ actually. The intrinsic layer is sandwiched by a p-gate layer 44 of p-Al$_{0.25}$Ga$_{0.75}$As having an impurity density of $1 \times 10^{19}$ and a thickness of 50Å and an n-gate layer 48 of n-Al$_{0.25}$Ga$_{0.75}$As having an impurity density of $1 \times 10^{17}$ cm$^{-3}$ and a thickness of 0.4 μm. Further, in FIG. 4, reference numeral 41 indicates a substrate of n-GaAs, 42 a buffer layer of n-GaAs, 43 a cathode layer of n-Al$_{0.4}$Ga$_{0.6}$As, 49 an anode layer of p-Al$_{0.4}$Ga$_{0.6}$As, 50 a cap layer of p-GaAs, and 51 an insulation film of SiO$_2$. A p-electrode 52 of AuZn alloy is of a SiO$_2$ planar striped structure for which the insulation film 51 is provided with a pair of striped apertures each having a width of 10 μm, and an isolation groove 57 is formed with a width of 50 μm to reach and divide the anode region 49 by a chemical etching thereby providing two regions 54A and 54B having an isolation resistance of 2KΩ on the p-electrode 52. Two anode electrodes 53A and 53B are provided on the two regions 54A and 54B of the p-electrode 52, and a cathode electrode 56 is provided on an n-electrode 55 which is provided on the back surface of the substrate 41.

In the optical semiconductor device in the second embodiment, the reason why the impurity densities of the GaAs layer 46 and the $Al_{0.25}Ga_{0.75}As$ layers 45 and 47 provided on both sides thereof are lower than those of the p and n-gate layers 44 and 48, and these intrinsic layers are provided between the p and n-gate layers 44 and 48 is such that electrons and holes are not trapped in the active layer 46 when a high electric field is applied across the active layer 46.

Figure 5:
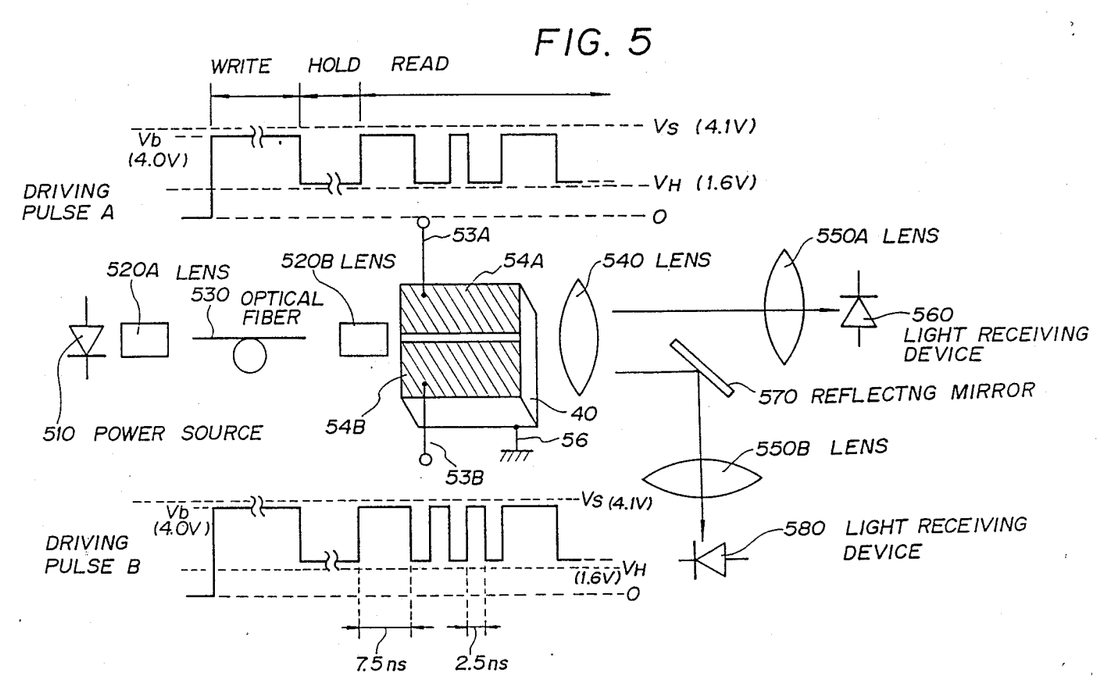
FIG. 5 is an explanatory view explaining operation of the optical semiconductor device in the second embodiment according to the invention.

FIG. 5 shows an experimental system in which an optical semiconductor device 40 as explained in FIG. 4 is operated. In the following experiment, the optical semiconductor device 40 having an oscillation threshold current of 160 mA, a differential quantum efficiency of 23%, a switching voltage of 4.1 V, and a holding voltage of 1.6 V has been adopted wherein input light 1A is supplied thereto to write optical informations thereinto and hold the information therein, and one or two of output lights 1B are radiated therefrom to read the informations stored therein. The experimental system comprises a semiconductor laser 510 for radiating a laser beam, a lens 520A for collimating the laser beam, an optical fiber 530 for transmitting the laser beam, a lens 520B for focusing the laser beam on a cleavage facet of the device 40, a lens 540 for collimating output light from the device 40, a lens 550A for focusing the output light from a region 54A of the device 40 on a light receiving device 560, a reflecting mirror 570 for reflecting the output light from a region 54B of the device 40, and a lens 550B for focusing the reflected output light on a light receiving device 580.

In operation, driving pulses as shown on the upper portion in FIG. 5 are applied to the anode electrode 53A of the device 40, and driving pulses as shown on the lower portion in FIG. 5 are applied to the anode electrode 53B of the device 40, while the cathode electrode 56 of the device 40 is connected to the ground. At the writing stage as indicated by "WRITE", biased voltage Vb of 4.0 V are applied to the anode electrodes 53A and 53B, and input light having a wavelength of 780 nm is supplied through a cleavage facet of the device 40 to an active layer 46 of GaAs therein at a timing of the input light. At this moment, the device is turned on at both regions 53A and 53B because the layers of the device are common except for the cap layer 50 and the anode layer 49. The biased voltages Vb are then decreased down to levels, for instance, 1.7 V each larger than a holding voltage of 1.6 V to hold an optical information based on the input light in both regions 53A and 53B at the holding stage as indicated by "HOLD". As a result, the ON state is held with a low consumption power of, for instance, less than 0.2 mW in which holding currents are 0.1 mA when the holding voltages are 1.7 V. This operation can be performed because the device 40 is of a p-n-p-n thyristor structure so that the ON state is held unless a biased voltage less than a holding voltage is applied thereto. Thereafter, the reading stage is commenced as indicated by "READ". At this stage, a biased voltage of 4.0 V is applied to the anode electrode 53A, while a biased voltage of 1.7 V is applied to the anode electrode 53B, and vice versa, or a biased voltage of 4.0 V is applied to both the anode electrodes 53A and 53B, as indicated by "DRIVING PULSE A" and "DRIVING PULSE B". As a result, light outputs are observed by the light receiving devices 560 and 580, respectively, when the biased voltages of 4.0 V are correspondingly applied to the anode electrodes 53A and 53B. It was confirmed that the reading of the optical information can be performed from both regions 54A and 54B under the biased voltage having a width of 7.5 ns simultaneously, and from either thereof under the biased voltage having a width of 2.5 ns alternately. In the latter situation where a biased voltage of 4.0 V is applied to the anode electrode 53A, and a biased voltage of 1.7 V is applied to the anode electrode 53B, a cross talk between light outputs is approximately 30 dB which is a satisfactory value for an isolation therebetween. As understood from the operation described above, there is provided an optical semiconductor memory in which two output lights are obtained by one input light, and either of the two output lights is switched on and off by a control signal. In the second embodiment, especially, a switching speed of more than 400 Mb/s is obtained because a light emitting mode is of an induced emission which is advantageous even in an optical isolation. On the other hand, a spontaneous emission may be adopted in the second embodiment as in the first embodiment. Further, the number of input and output lights may be changed dependent on a specified use, and the direction of an individual output light or all of the output lights may be parallel or vertical to the surface plain of the device. In accordance with the selection of the above described number and direction, an optical connection is freely changed so that the device is widely applied to an optical system. Still further, a cathode region may be electrically separated, although an anode region is electrically separated in the second embodiment. At any rate, a gate region should not be electrically separated in embodying an optical semiconductor device according to the invention. In other words, gate regions which are physically divided may be connected electrically to provide a non-separated gate region.

In an optical semiconductor device in the second embodiment according to the invention, a light output which is of a high coherence, a high intensity and a sharp spectrum width is obtained, while a light output of a spontaneous emission is dull in a spectrum width and low in an intensity in an optical semiconductor device in the first embodiment.

Figure 6A:
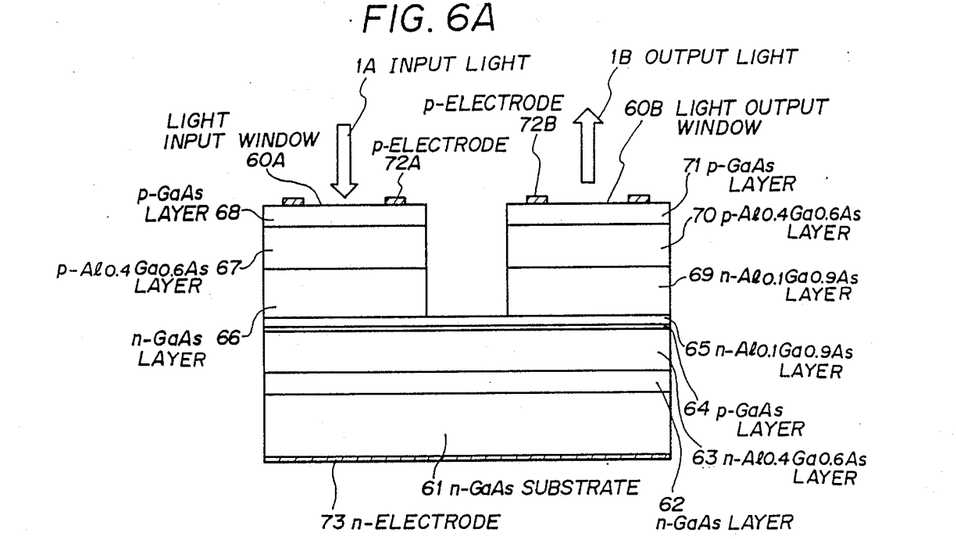
FIGS. 6A and 6B are a cross sectional and top plain views showing an optical semiconductor device in a third embodiment according to the invention.
Figure 6B:
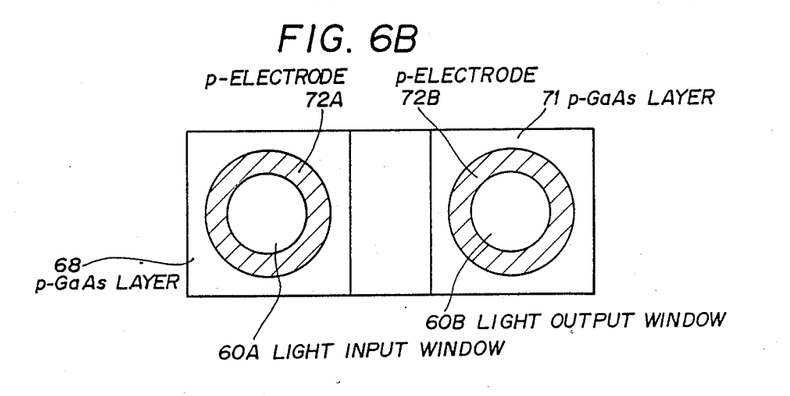

In FIGS. 6A and 6B, there is shown an optical semiconductor device in a third embodiment according to the invention. The optical semiconductor device is fabricated by following procedures. First, a buffer layer 62 of n-GaAs having an impurity density of $5 \times 10^{17}$ cm$^{-3}$ and a thickness of 0.5 μm, a cathode layer 63 of n-$Al_{0.4}Ga_{0.6}As$ having an impurity density of $5 \times 10^{17}$ cm$^{-2}$ and a thickness of 1 μm, a p-Gate layer 64 of p-GaAs having a impurity density of $1 \times 10^{19}$ cm$^{-3}$ and a thickness of 50 Å, n-gate layer 65 of n-$Al_{0.1}Ga_{0.9}As$ having an impurity density of $1 \times 10^{17}$ cm$^{-3}$ and a thickness of 500 Å, a light receiving layer 66 of n-GaAs having an impurity density of $1 \times 10^{17}$ cm$^{-3}$ and a thickness of 1 μm, a light receiving anode layer 67 of p-$Al_{0.4}Ga_{0.6}As$ having an impurity density of $5 \times 10^{18}$ cm$^{-3}$ and a thickness of 1 μm, and a contacting layer 68 of p-GaAs having an impurity density of $1 \times 10^{19}$ cm$^{-3}$ and a thickness of 0.1 μm are grown sequentially on a substrate 61 of n-GaAs by using a MOCVD process. Thereafter, the layers 66, 67 and 68 are selectively etched to be removed thereby exposing the n-gate layer 65 except for a rectangular area of 60 μm×60 μm which will be a light receiving portion. Then, a light emitting layer 69 of n-$Al_{0.1}Ga_{0.9}As$ having an impurity density of $1 \times 10^{17}$ cm$^{-3}$ and a thickness of 1 μm, a light emitting anode layer 70 of p-$Al_{0.4}Ga_{0.6}As$ having an impurity density of $5 \times 10^{18}$ cm$^{-3}$ and a thickness of 1 μm, and a contacting layer 71 of p-GaAs having an impurity density of $1 \times 10^{19}$ cm$^{-3}$ and a thickness of 0.1 μm are grown sequentially on the exposed n-gate layer 65 by using a MOCVD process. Next, the layers 69, 70 and 71 are selectively etched to be removed thereby exposing the n-gate layer 65 except for a rectangle area of 65 μm×65 μm which will be a light emitting portion. Finally, ring shaped p-electrodes 72A and 72B are provided on the top surfaces of the contacting layer 68 for the light receiving portion and the contacting layer 71 for the light emitting portion, nd an n-electrode 73 is provided on the back surface of the substrate 61. In FIGS. 6A and 6B, reference numerals 72A and 72B indicate light input and output windows, respectively.

Figure 1A:
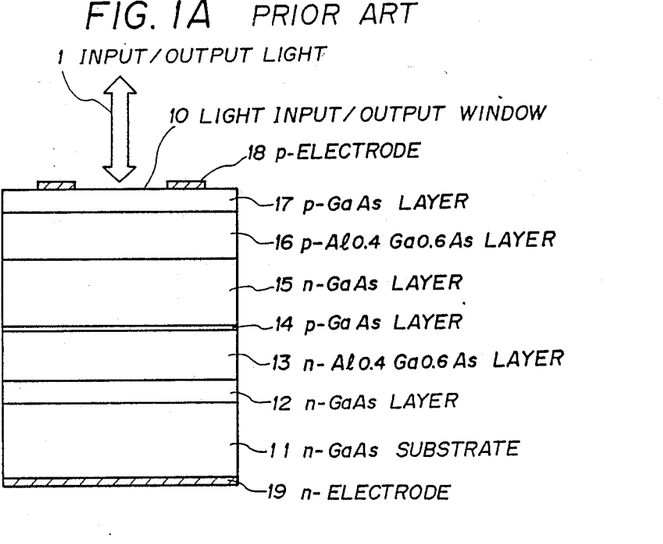
FIGS. 1A and 1B are a cross sectional and top plain views showing a conventional optical p-n-p-n device.
Figure 1B:
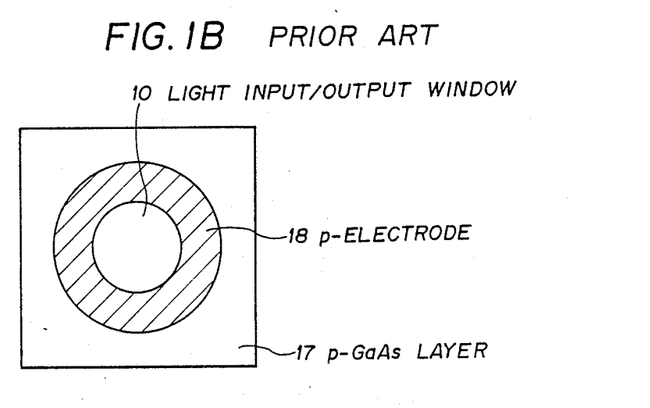
Figure 2A:
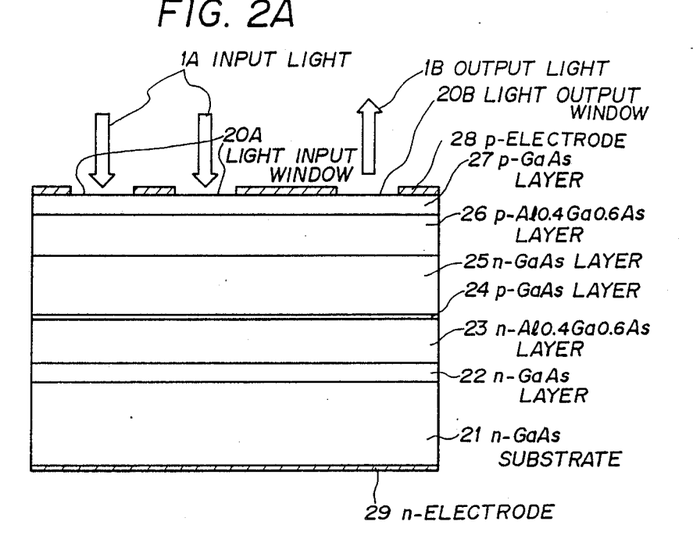
FIGS. 2A and 2B are a cross sectional and top plain views showing an optical semiconductor device in a first embodiment according to the invention.
Figure 2B:
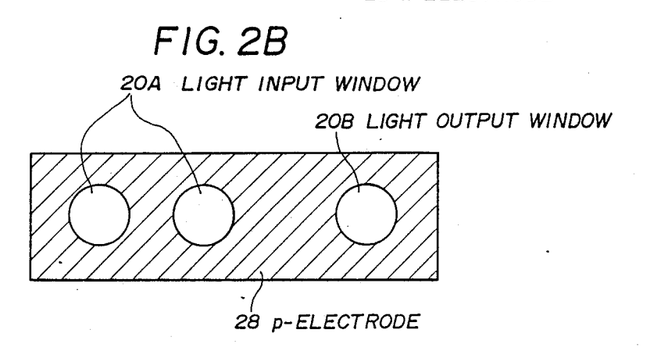

In the conventional optical semiconductor as described in FIGS. 1A and 1B, input and output lights are transmitted through a single light input/output window so that the input and output lights are positioned on a common light path. This results in the increase of optical parts and the difficulty in the alignment of light axes. Further, light absorption and light emission are performed in a common semiconductor layer because the single light input/output window is used therein. In fact, the n-GaAs layer 15 performs as a light absorption layer and an active layer. As a result, receiving light is performed in a shorter wavelength than an absorption edge of the n-GaAs layer so that a wavelength is shifted in the direction of a longer wavelength in a case where such devices are connected in multiple stages. Further, the photosensitivity is decreased because a light absorption is performed in a wavelength corresponding to an absorption edge in a case where the device is used with the same wavelength.

According to the invention, an optical semiconductor device having an optimum wavelength and a structure is obtained since separated semiconductor layers are utilized because it is possible to use separated windows for input and output lights. That is to say, the n-GaAs layer 66 is utilized as a light absorption layer for the light receiving portion in the third embodiment, while the n-Al$_{0.1}$Ga$_{0.9}$As layer 69 having a light emitting wavelength shorter than an absorption edge of GaAs is utilized as an active layer for the light emitting portion therein. By this structure, the decrease of photosensitivity which occured in the conventional optical semiconductor device in the case where light emitted in a GaAs layer is received in the GaAs layer is overcome. Further, a thickness of an active layer must be as thin as approximately 0.1 μm and of a minute structure in the case where an optical semiconductor device includes an induced emission type of a light emitting portion. In this respect, the deterioration of photosensitivity is caused due to the decrease of a thickness of a light absorption layer and the decrease of a light receiving area in the conventional optical semiconductor device having a common layer for input and output lights, while the disadvantage is also overcome in the invention because the light receiving and emitting portions can be optimum structures since both portions are separately provided. Still further, if semiconductors each having a forbidden band gap largely different from the other is utilized for absorption and active layers, an optical semiconductor device can be applied to a wavelength conversion device.

As understood from the explanations in the first to third embodiments, gate regions must be electrically connected to each other in an optical semiconductor device according to the invention. The optical semiconductor device is approximately considered to be a semiconductor device in which an n-p-n transistor and the p-n-p transistor are connected at a connector and base regions to each other because it is basically a device having a p-n-p-n junction. By this structure, electric current begins to flow in the optical semiconductor device which is then turned on in accordance with a positive feedback effect of the two transistors which are triggered by carriers produced in avalanche or light effect when a biased voltage to be applied to the optical semiconductor device which is in the OFF state is increased. When the p-n-p-n device is shifted to the ON state, carriers are accumulated in n and p regions thereof, and all of the p-n junctions are forward-biased to finally be turned on. For this reason, a connector and a base of the transistors which is approximately considered to be two transistors as mentioned above must be connected to utilize an inherent switching functions of a p-n-p-n device. This is identical to a structure in which an n-gate region and a p-gate region are electrically connected in an actual p-n-p-n device. This means that anode and cathode regions can be divided into a predetermined number of portions which are turned on and off simultaneously, only if n-gate and p-gate regions are common to the whole device.

Although a semiconductor of GaAs/AlGaAs system is used in the first to third embodiments, a material of another system like an InP system may be adopted to provide the same advantages.

Although the invention has been described with respect to specific embodiment for complete and clear disclosure, the appended claims are not to be thus limited but are to be construed as embodying all modifications and alternative constructions that may occur to one skilled in the art which fairly fall within the basic teaching herein set forth.

What is claimed is:
1. An optical semiconductor device comprising:
a cathode region formed by an n-semiconductor layer,
an anode region formed by a p-semiconductor layer,
a gate region and an active region sandwiched between said cathode region and said anode region,
an n-electrode provided on the side of said cathode region, and
a p-electrode provided on the side of said anode region,
wherein a forbidden band gap of said gate region is narrower than that of said cathode region and said anode region,
one of said cathode region and said anode region is divided into plural regions, while said gate region and said active region are common to said plural regions, and
one oof said n-electrode and said p-electrode is divided into plural electrodes correspondingly to said plural regions of said one of said cathode region and said anode region.

2. An optical semiconductor device according to claim 1, wherein a light output is obtained in a limited region of said active region in accordance with a voltage applied across an electrode selected from said plural electrodes of said one of said n-electrode and said p-electrode and the other one of said n-electrode and said p-electrode such that when said selected electrode is an n-electrode the other one of said electrodes is a p-electrode and vice versa.

3. An optical semiconductor device according to claim 2, wherein said light output is radiated from a portion of a cleavage facet of said active region corresponding to said limited region of said active region.

* * * * *